United States Patent
Ichijyo et al.

(10) Patent No.: US 11,973,433 B2
(45) Date of Patent: Apr. 30, 2024

(54) POWER CONVERSION APPARATUS

(71) Applicant: DENSO CORPORATION, Kariya (JP)

(72) Inventors: Hiromi Ichijyo, Kariya (JP); Yuu Yamahira, Kariya (JP); Kazuya Takeuchi, Kariya (JP); Masanori Sakata, Kariya (JP); Masayoshi Nishihata, Kariya (JP)

(73) Assignee: DENSO CORPORATION, Kariya (JP)

( * ) Notice: Subject to any disclaimer, the term of this patent is extended or adjusted under 35 U.S.C. 154(b) by 245 days.

(21) Appl. No.: 17/690,170

(22) Filed: Mar. 9, 2022

(65) Prior Publication Data
US 2022/0200471 A1 Jun. 23, 2022

Related U.S. Application Data

(63) Continuation of application No. PCT/JP2020/031965, filed on Aug. 25, 2020.

(30) Foreign Application Priority Data

Sep. 10, 2019 (JP) ................................. 2019-164858

(51) Int. Cl.
*H02M 7/00* (2006.01)
*H01L 23/31* (2006.01)
(Continued)

(52) U.S. Cl.
CPC ........ *H02M 7/003* (2013.01); *H01L 23/3107* (2013.01); *H01L 23/5286* (2013.01);
(Continued)

(58) Field of Classification Search
CPC ..... G06F 1/263; H02M 1/10; H02M 3/33561; H02M 7/003; H02M 3/088; H02M 3/1584;
(Continued)

(56) References Cited

U.S. PATENT DOCUMENTS

| 10,720,383 B2* | 7/2020 | Hiramitsu ......... H01L 23/49513 |
| 10,854,589 B2* | 12/2020 | Sugita ............... H01L 23/49575 |
| 2019/0173394 A1* | 6/2019 | Miura ..................... H02M 1/08 |

FOREIGN PATENT DOCUMENTS

| JP | 2007-110870 A | 4/2007 |
| JP | 2017-099140 A | 6/2017 |

OTHER PUBLICATIONS

U.S. Appl. No. 17/690,141, filed Mar. 9, 2022 in the name of Ichijyo et al.

* cited by examiner

*Primary Examiner* — Jeffrey A Gblende
(74) *Attorney, Agent, or Firm* — Oliff PLC

(57) ABSTRACT

A first module includes a first switch having a first electrode and a second electrode; a second switch having a third electrode and a fourth electrode; a second internal bus bar connecting the second electrode with the third electrode; and a first resin member encapsulating those components. A second module with includes a third switch having a fifth electrode and a sixth electrode; a fourth switch having a seventh electrode and an eighth electrode; a fifth internal bus bar connecting the sixth electrode with the seventh electrode; and a second resin member encapsulating those components. At least one of a first terminal of the second internal bus bar exposed from the first resin member and a second terminal of the fifth internal bus bar exposed from the second resin member extends toward the other and are directly joined with each other.

3 Claims, 10 Drawing Sheets

(51) Int. Cl.
*H01L 23/528* (2006.01)
*H01L 25/18* (2023.01)
*H02M 7/5387* (2007.01)
*H02P 27/06* (2006.01)

(52) U.S. Cl.
CPC .......... *H01L 25/18* (2013.01); *H02M 7/5387* (2013.01); *H02P 27/06* (2013.01)

(58) Field of Classification Search
CPC .. H02M 1/084; H02M 3/003; H02M 3/33523; H01L 25/112; H01L 25/115; H01L 23/34; H01L 23/528; H01L 27/088; H01L 29/088; H01L 29/2003; H01L 23/49503; H01L 23/49562; H01L 23/49575; H01L 23/62; H01L 23/072; H01L 23/0248; H01L 29/1033; H01L 29/402; H01L 29/41758; H01R 13/6675; H01R 29/00; H01R 31/065; G09G 3/20; H02K 11/046; H01F 2027/406; H01F 27/30; H01F 41/0246; H05K 7/20927; H05K 2201/10166; H05K 2201/10507; H05K 7/2089

See application file for complete search history.

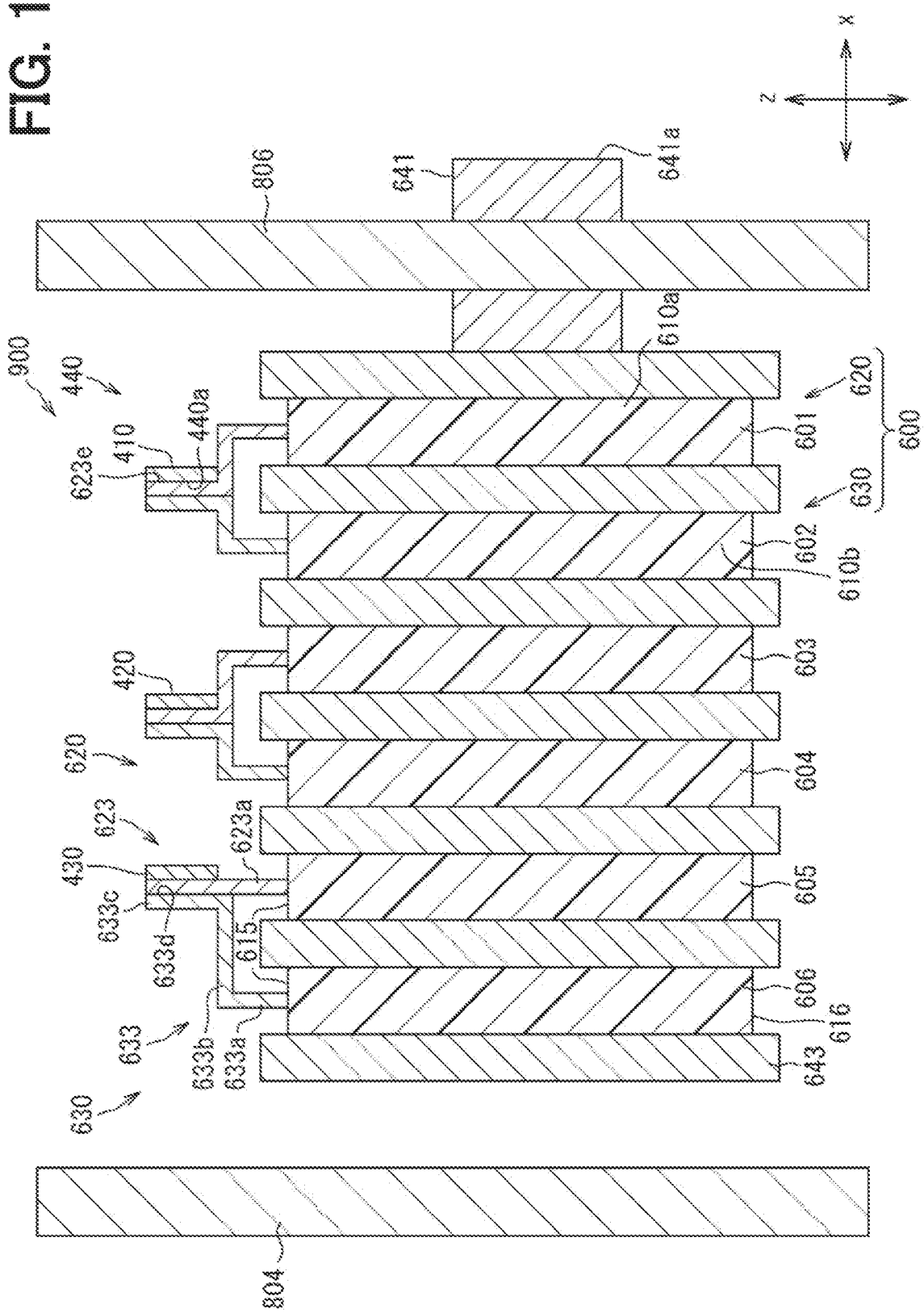

POWER CONVERSION APPARATUS

CROSS REFERENCE TO RELATED APPLICATION

The present application is a continuation application of International Patent Application No. PCT/JP2020/031965 filed on Aug. 25, 2020, which designated the U.S. and claims the benefit of priority from Japanese Patent Application No. 2019-164858 filed on Sep. 10, 2019. The entire disclosures of all of the above applications are incorporated herein by reference.

TECHNICAL FIELD

The present disclosure relates to a power conversion apparatus.

BACKGROUND

Conventionally, a semiconductor module composed of layered semiconductor devices is known.

SUMMARY

According to a first aspect of the present disclosure, a power conversion device according to an example of the present disclosure includes a first module and a second module. The first module includes a first switch having a first electrode and a second electrode; a second switch having a third electrode and a fourth electrode; a first internal bus bar connected to the first electrode; a second internal bus bar connecting the second electrode with the third electrode; a third internal bus bar connected to the fourth electrode; and a first resin member that encapsulates these components. The second module with includes a third switch having a fifth electrode and a sixth electrode; a fourth switch having a seventh electrode and an eighth electrode; a fourth internal bus bar connected to the fifth electrode; a fifth internal bus bar connecting the sixth electrode with the seventh electrode; a sixth internal bus bar connected to the eighth electrode; and a second resin member that encapsulates these components.

BRIEF DESCRIPTION OF THE DRAWINGS

The above and other objects, features and advantages of the present disclosure will become more apparent from the following detailed description made with reference to the accompanying drawings. In the drawings:

FIG. 10 is a sectional view illustrating a modification of the power module.

DETAILED DESCRIPTION

Figure 1:
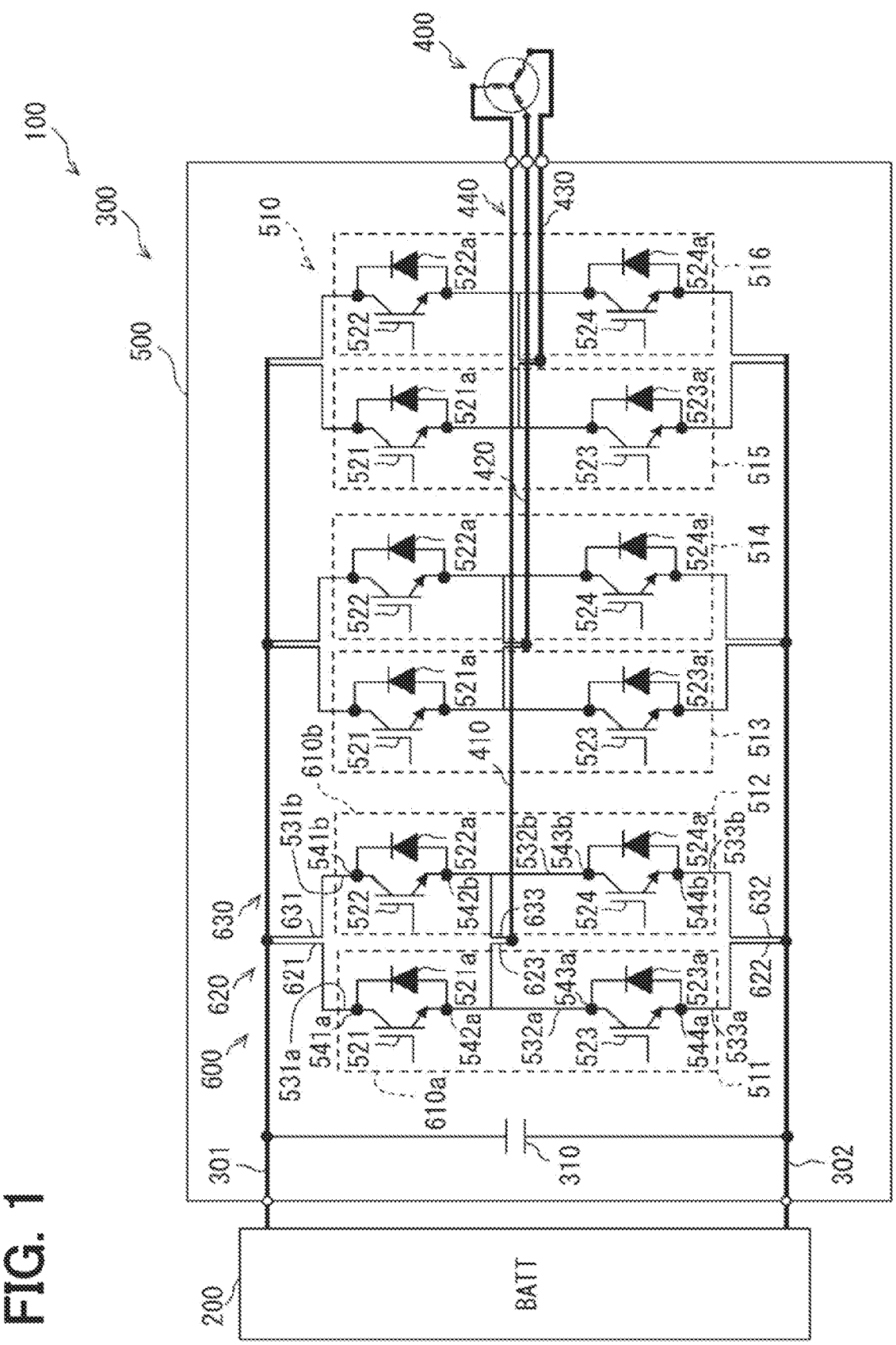
FIG. 1 is a circuit diagram illustrating an in-vehicle system.

The description below explains examples of the present application.

According to an example of the present application, multiple semiconductor modules are layered to configure a layered unit. The main body of the semiconductor module is made of resin and contains two transistors. The two transistors are connected in series inside the main body.

The top surface of the main body partially exposes a midpoint terminal connected to the midpoint of two transistors connected in series.

In the layered unit according to this example, the midpoint terminals are exposed from the top surface of the semiconductor module and are placed in a layering direction to place the multiple semiconductor modules. Two semiconductor modules are adjacently placed in the layering direction. The midpoint terminal of one of the two semiconductor modules is connected to the midpoint terminal of the other via a bus bar. The bus bar may increase inductance components between the two semiconductor modules.

A power conversion device according to an example of the present disclosure includes a first module including a first switch having a first electrode and a second electrode; a second switch having a third electrode and a fourth electrode; a first internal bus bar connected to the first electrode; a second internal bus bar connecting the second electrode with the third electrode; a third internal bus bar connected to the fourth electrode; and a first resin member that encapsulates these components; and a second module with including a third switch having a fifth electrode and a sixth electrode; a fourth switch having a seventh electrode and an eighth electrode; a fourth internal bus bar connected to the fifth electrode; a fifth internal bus bar connecting the sixth electrode with the seventh electrode; a sixth internal bus bar connected to the eighth electrode; and a second resin member that encapsulates these components.

The first internal bus bar, the second internal bus bar, and the third internal bus bar are partially exposed from the first resin member.

The fourth internal bus bar, the fifth internal bus bar, and the sixth internal bus bar are partially exposed from the second resin member.

The first internal bus bar and the fourth internal bus bar are connected with each other, the second internal bus bar and the fifth internal bus bar are connected with each other, and the third internal bus bar and the sixth internal bus bar are connected with each other.

At least one of a first terminal exposed from the first resin member in the second internal bus bar and a second terminal exposed from the second resin member in the fifth internal bus bar extends toward the other of the second internal bus bar and the fifth internal bus bar, such that the second internal bus bar and the fifth internal bus bar are directly joined with each other.

According to the present disclosure, the terminal exposed from the first resin member for the second internal bus bar and the terminal exposed from the second resin member for the fifth internal bus bar are directly joined. Therefore, the configuration enables to easily inhibit an increase in inductance components between the first module and the second module compared to a configuration where the second internal bus bar and the fifth internal bus bar are indirectly joined via an inclusion such as a conductive member.

The description below explains embodiments for carrying out the present disclosure by reference to the drawings. The same reference numerals are given to parts in each embodiment similar to those described in the preceding embodiment and a redundant description may be omitted for simplicity. If only part of a configuration in each embodiment is described, other parts in the configuration may conform to those described in the preceding embodiment.

Each embodiment may contain parts that are explicitly described to be capable of combination. In addition, the embodiments can be partially combined, if possible, even if the partial combination is not explicitly described to be possible.

First Embodiment

The description below first explains an in-vehicle system 100 provided with a power conversion apparatus 300 based on FIG. 1. The in-vehicle system 100 configures a system for electric vehicles. The in-vehicle system 100 includes a battery 200, a power conversion apparatus 300, and a motor 400.

The in-vehicle system 100 includes multiple ECUs (unshown). The ECUs mutually transmit and receive signals via the bus wiring. The ECUs cooperatively control an electric vehicle. The ECUs control the regeneration and driving of the motor 400 according to SOC of the battery 200. SOC stands for a state of charge. ECU stands for an electronic control unit.

The battery 200 includes multiple secondary batteries. The secondary batteries configure a series-connected battery stack. The SOC of the battery stack corresponds to the SOC of the battery 200. The secondary battery is available as a lithium-ion secondary battery, a nickel-hydrogen secondary battery, or an organic radical battery, for example.

The power conversion apparatus 300 includes an inverter 500. As the inverter 500, the power conversion apparatus 300 performs power conversion between the battery 200 and the motor 400. The power conversion apparatus 300 converts the DC power of the battery 200 into AC power. The power conversion apparatus 300 converts the AC power generated by the power generation (regeneration) of the motor 400 into DC power.

The motor 400 is connected to an output shaft (unshown) of the electric vehicle. The rotational energy of the motor 400 is transmitted to a traveling wheel of the electric vehicle via the output shaft. The rotational energy of the traveling wheel is transmitted to the motor 400 via the output shaft.

The motor 400 is regenerated by the rotational energy transmitted from the traveling wheels. The power conversion apparatus 300 converts the regenerated AC power into DC power. The DC power is supplied to the battery 200. The DC power is also supplied to various electric loads mounted on the electric vehicle.

Inverter

The inverter 500 includes a capacitor 310 and a switch group 510. The battery 200 connects with a first power supply bus bar 301 and a second power supply bus bar 302. A capacitor 310 and the switch group 510 are connected in parallel between the first power supply bus bar 301 and the second power supply bus bar 302. The switch group 510 and the motor 400 are connected via an output bus bar 440.

When the motor 400 is driven, a control signal from the ECU provides PWM control for a high-side switch and a low-side switch included in the switch group 510. The inverter 500 then generates a three-phase alternating current. When the motor 400 generates (regenerates) power, the ECU stops the output of control signals, for example. The AC power generated by the motor 400 passes through a diode included in the three-phase switch group 510. As a result, the AC power is converted into DC power.

The present embodiment uses an n-channel type IGBT as switches included in the switch group 510. Instead of IGBTs, MOSFETs can be used as switches. The diode is optional when MOSFETs are used as the switches.

These switches can be manufactured through the use of semiconductors such as Si and wide-gap semiconductors such as SiC. No limitations are placed on constituent materials for the semiconductor devices.

The switch group 510 includes a first U-phase switch 511, a second U-phase switch 512, a first V-phase switch 513, a second V-phase switch 514, a first W-phase switch 515, and a second W-phase switch 516. Each of these switches includes two switches connected in series.

The first U-phase switch 511, the first V-phase switch 513, and the first W-phase switch 515 each include a first high-side switch 521 and a first low-side switch 523 as switches. The first U-phase switch 511, the first V-phase switch 513, and the first W-phase switch 515 each include a first high-side diode 521a and a first low-side diode 523a.

The cathode electrode of the first high-side diode 521a is connected to a first collector electrode 541a as the collector electrode of the first high-side switch 521. The anode electrode of the first high-side diode 521a is connected to a first emitter electrode 542a as the emitter electrode of the first high-side switch 521. Consequently, the first high-side diode 521a is connected to the first high-side switch 521 in an antiparallel manner. The first high-side switch 521 is comparable to a first switch. The first collector electrode 541a is comparable to a first electrode. The first emitter electrode 542a is comparable to a second electrode.

The cathode electrode of the first low-side diode 523a is connected to a second collector electrode 543a as the collector electrode of the first low-side switch 523. The anode electrode of the first low-side diode 523a is connected to a second emitter electrode 544a as the emitter electrode of the first low-side switch 523. Consequently, the first low-side diode 523a is connected to the first low-side switch 523 in an antiparallel manner. The first low-side switch 523 is comparable to a second switch. The second collector electrode 543a is comparable to a third electrode. The second emitter electrode 544a is comparable to a fourth electrode.

The second U-phase switch 512, the second V-phase switch 514, and the second W-phase switch 516 each include a second high-side switch 522 and a second low-side switch 524 as switches. The second U-phase switch 512, the second V-phase switch 514, and the second W-phase switch 516 each include a second high-side diode 522a and a second low-side diode 524a.

The cathode electrode of the second high-side diode 522a is connected to a third collector electrode 541b as the collector electrode of the second high-side switch 522. The anode electrode of the second high-side diode 522a is connected to a third emitter electrode 542b as the emitter electrode of the second high-side switch 522. Consequently, the second high-side diode 522a is connected to the second high-side switch 522 in an antiparallel manner. The second high-side switch 522 is comparable to a third switch. The third collector electrode 541b is comparable to a fifth electrode. The third emitter electrode 542b is comparable to a sixth electrode.

The cathode electrode of the second low-side diode 524a is connected to a fourth collector electrode 543b as the collector electrode of the second low-side switch 524. The anode electrode of the second low-side diode 524a is connected to a fourth emitter electrode 544b as the emitter electrode of the second low-side switch 524. Consequently, the second low-side diode 524a is connected to the second low-side switch 524 in an antiparallel manner. The second low-side switch 524 is comparable to a fourth switch. The fourth collector electrode 543b is comparable to a seventh electrode. The fourth emitter electrode 544b is comparable to an eighth electrode.

First Module

The first high-side switch 521, the first high-side diode 521a, the first low-side switch 523, and the first low-side diode 523a are encapsulated with the first resin member 610a to configure a first module 620 as the switch module 600.

In the first resin member 610a of the first module 620, the first emitter electrode 542a of the first high-side switch 521 and the second collector electrode 543a of the first low-side switch 523 are connected via the second internal bus bar 532a. Consequently, the first high-side switch 521 and the first low-side switch 523 are connected in series in the first resin member 610a.

In the first resin member 610a, the first internal bus bar 531a is connected to the first collector electrode 541a of the first high-side switch 521. The third internal bus bar 533a is connected to the second emitter electrode 544a of the first low-side switch 523. From the first resin member 610a, the first internal bus bar 531a, the second internal bus bar 532a, and the third internal bus bar 533a are partially exposed as a first positive electrode terminal 621, a first output terminal 623, and a first negative electrode terminal 622, respectively. The first positive electrode terminal 621 is comparable to a third terminal. The first output terminal 623 is comparable to a first terminal. The first negative electrode terminal 622 is comparable to a fifth terminal.

Second Module

The second high-side switch 522, the second high-side diode 522a, the second low-side switch 524, and the second low-side diode 524a are encapsulated with the second resin member 610b to configure a second module 630 as the switch module 600.

In the second resin member 610b of the second module 630, the third emitter electrode 542b of the second high-side switch 522 and the fourth collector electrode 543b of the second low-side switch 524 are connected via the fifth internal bus bar 532b. Consequently, the second high-side switch 522 and the second low-side switch 524 are connected in series in the second resin member 610b.

In the second resin member 610b, the fourth internal bus bar 531b is connected to a third collector electrode 541b of the second high-side switch 522. The sixth internal bus bar 533b is connected to a fourth emitter electrode 544b of the second low-side switch 524. From the second resin member 610b, the fourth internal bus bar 531b, the fifth internal bus bar 532b, and the sixth internal bus bar 533b are partially exposed as a second positive electrode terminal 631, a second output terminal 633, and a second negative electrode terminal 632, respectively. The second positive electrode terminal 631 is comparable to a fourth terminal. The second output terminal 633 is comparable to a second terminal. The second negative electrode terminal 632 is comparable to a sixth terminal.

First Module and Second Module

As above, the first positive electrode terminal 621, the first negative electrode terminal 622, and the first output terminal 623 are exposed from the first resin member 610a of the first module 620. The second positive electrode terminal 631, the second negative electrode terminal 632, and the second output terminal 633 are exposed from the second resin member 610b of the second module 630.

As illustrated in FIG. 1, the first positive electrode terminal 621 and the second positive electrode terminal 631 are connected. The first negative electrode terminal 622 and the second negative electrode terminal 632 are connected. The first output terminal 623 and the second output terminal 633 are connected. Consequently, a closed loop is formed toward the positive electrode via the first high-side switch 521 and the second high-side switch 522. A closed loop is formed toward the negative electrode via the first low-side switch 523 and the second low-side switch 524.

The first power supply bus bar 301 is connected to the first positive electrode terminal 621. The first power supply bus bar 301 is connected to one electrode of the capacitor 310. The second power supply bus bar 302 is connected to the first negative electrode terminal 622. The second power supply bus bar 302 is connected to the other electrode of the capacitor 310. Consequently, a closed loop is formed via the capacitor 310 and the first module 620. A closed loop is formed via the capacitor 310 and the second module 630. The first power supply bus bar 301 may be connected to the second positive electrode terminal 631. The second power supply bus bar 302 may be connected to the second negative electrode terminal 632.

The output bus bar 440 is connected to the first output terminal 623. The first output terminal 623 is connected to a stator coil of the motor 400 via the output bus bar 440. The output bus bar 440 may be connected to the second output terminal 633.

The switch modules 600 in three-phases, namely, U-phase through W-phase, are distinguished as follows. The first module 620 including the first U-phase switch 511 is denoted as a first U-phase module 601. The first module 620 including the first V-phase switch 513 is denoted as a first V-phase module 603. The first module 620 including the first W-phase switch 515 is denoted as a first W-phase module 605.

The second module 630 including the second U-phase switch 512 is denoted as a second U-phase module 602. The second module 630 including the second V-phase switch 514 is denoted as a second V-phase module 604. The second module 630 including the second W-phase switch 516 is denoted as a second W-phase module 606.

The output bus bar 440 connected to a U-phase stator coil is denoted as a U-phase bus bar 410. The output bus bar 440 connected to a V-phase stator coil is denoted as a V-phase bus bar 420. The output bus bar 440 connected to a W-phase stator coil is denoted as a W-phase bus bar 430.

The first output terminal 623 of the first U-phase module 601 is connected to the U-phase stator coil of the motor 400 via the U-phase bus bar 410.

The first output terminal 623 of the first V-phase module 603 is connected to the V-phase stator coil of the motor 400 via the V-phase bus bar 420.

The first output terminal 623 of the first W-phase module 605 is connected to the W-phase stator coil of the motor 400 via the W-phase bus bar 430.

Configuration of the Power Conversion Apparatus

The configuration of the power conversion apparatus 300 will be described below. The following assumes three directions such as x, y, and z directions that are orthogonal to each other. And the description of "direction" is omitted from the drawings. The battery 200 is abbreviated as "BATT" in the drawings.

The power conversion apparatus 300 includes a cooler 640, a capacitor case 700, and a case 800 in addition to the circuit components described so far.

As above, the inverter 500 includes multiple switch modules 600. The cooler 640 stores and cools the switch modules 600. The switch modules 600 are stored in the cooler 640 to configure a power module 900.

The capacitor case 700 stores the capacitor 310. Further, the capacitor case 700 supports the first power supply bus bar 301 and the second power supply bus bar 302.

The case 800 stores the capacitor case 700 and the power module 900.

Figure 2:
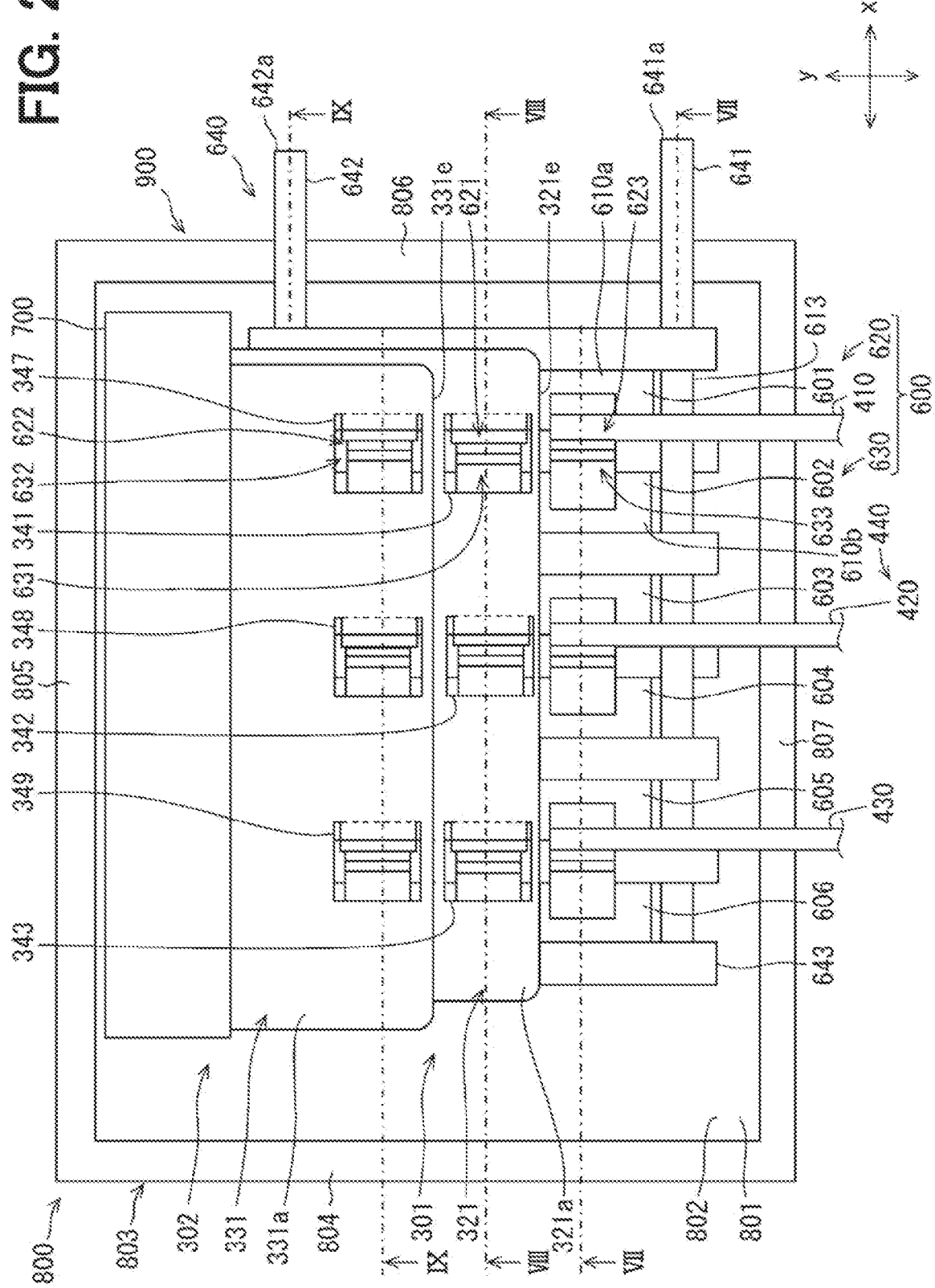
FIG. 2 is a plan view illustrating mode of storing a power module in a case.

As illustrated in FIG. 2, the case 800 has a bottom portion 801 and a side portion 803. The bottom portion 801 is thin in the z-direction. The side portion 803 annularly rises in the z-direction from edges of an inner bottom surface 802 of the bottom portion 801. The side portion 803 has a first sidewall 804, a second sidewall 805, a third sidewall 806, and a fourth sidewall 807. The first sidewall 804 separately faces the third sidewall 806 in the x-direction. The second sidewall 805 separately faces the fourth sidewall 807 in the y-direction. The first sidewall 804, the second sidewall 805, the third sidewall 806, and the fourth sidewall 807 are annularly connected in the z-direction in a circumferential direction. The capacitor case 700 and the power module 900 are stored in a storage space partitioned by the bottom portion 801 and the side portion 803.

Power Module

The power module 900 includes the switch modules 600 and the cooler 640. As illustrated in FIGS. 3 through 9, a resin member of the switch module 600 is shaped to be thin in the x-direction. The resin member is a generic name for the first resin member 610a and the second resin member 610b. The resin member includes a first principal surface 611, a second principal surface 612, a first side surface 613, a second side surface 614, a top surface 615, and a bottom surface 616. The first principal surface 611 and the second principal surface 612 are separately placed in the x-direction. The first side surface 613 and the second side surface 614 are separately placed in the y-direction. The top surface 615 and the bottom surface 616 are separately placed in the z-direction.

Figure 3:
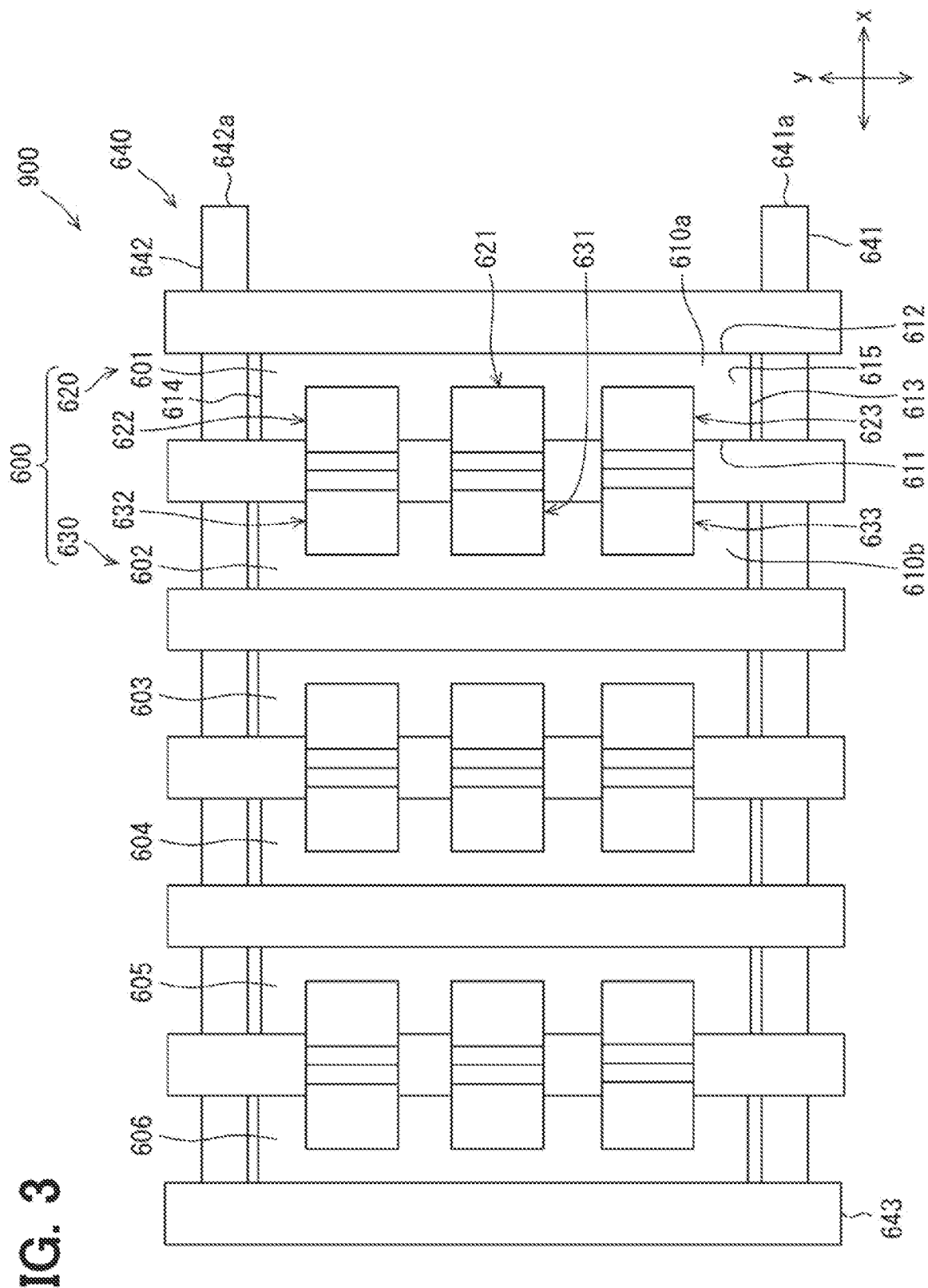
FIG. 3 is a plan view illustrating the power module.

As illustrated in FIG. 3, the first positive electrode terminal 621, the first negative electrode terminal 622, and the first output terminal 623 are exposed from the top surface 615 of the first module 620. The first output terminal 623, the first positive electrode terminal 621, and the first negative electrode terminal 622 are placed in this order from the first side surface 613 to the second side surface 614 in the y-direction.

The second positive electrode terminal 631, the second negative electrode terminal 632, and the second output terminal 633 are exposed from the top surface 615 of the second module 630. The second output terminal 633, the second positive electrode terminal 631, and the second negative electrode terminal 632 are placed in this order from the first side surface 613 to the second side surface 614 in the y-direction.

As illustrated in FIGS. 2 through 6, the cooler 640 includes a supply pipe 641, a discharge pipe 642, and multiple relay pipes 643. The supply pipe 641 and discharge pipe 642 are connected via multiple relay pipes 643. Refrigerant is supplied to the supply pipe 641. The refrigerant flows from the supply pipe 641 to the discharge pipe 642 via the relay pipes 643. The refrigerant is supplied to a supply port 641a from the outside of the supply pipe 641. A discharge port 642a discharges the refrigerant supplied from the relay pipe 643 to the outside of the discharge pipe 642. The supply port 641a and the discharge port 642a are separately placed in the y-direction.

The supply pipe 641 and the discharge pipe 642 extend in the x-direction. The supply pipe 641 and the discharge pipe 642 are separated in the y-direction. Each of the relay pipes 643 extends in the y-direction from the supply pipe 641 to the discharge pipe 642. The relay pipes 643 are separately placed in the x-direction. A gap is formed between two adjacent relay pipes 643. The cooler 640 includes a total of six gaps. Each of the first U-phase module 601 through the second W-phase module 606 is placed in each of the six gaps. The power module 900 is thus configured.

As illustrated in FIG. 3, each of the switch modules 600 is placed in the gap so that the second principal surface 612 is located toward the supply port 641a and the discharge port 642a. The multiple switch modules 600 are provided in the gaps so that the first side surface 613 is located toward the supply pipe 641 in the y-direction and the second side surface 614 is located toward the discharge pipe 642 in the y-direction.

Therefore, the first output terminal 623, the first positive electrode terminal 621, and the first negative electrode terminal 622 exposed from the first module 620 are placed in order from the supply pipe 641 to the discharge pipe 642. The second output terminal 633, the second positive electrode terminal 631, and the second negative electrode terminal 632 discharged from the second module 630 are placed in order from the supply pipe 641 to the discharge pipe 642.

The principal surface of each of the six switch modules 600 touches the relay pipe 643. The force given from an unshown spring increases a contact area between the switch module 600 and the relay pipe 643. This makes it possible to dissipate the heat generated from the six switch modules 600 to the refrigerant via the relay pipe 643.

The first U-phase module 601, the second U-phase module 602, the first V-phase module 603, the second V-phase module 604, the first W-phase module 605, and the second W-phase module 606 are placed in this order to separate from the supply port 641a and the discharge port 642a.

Output Terminals

Figure 7:
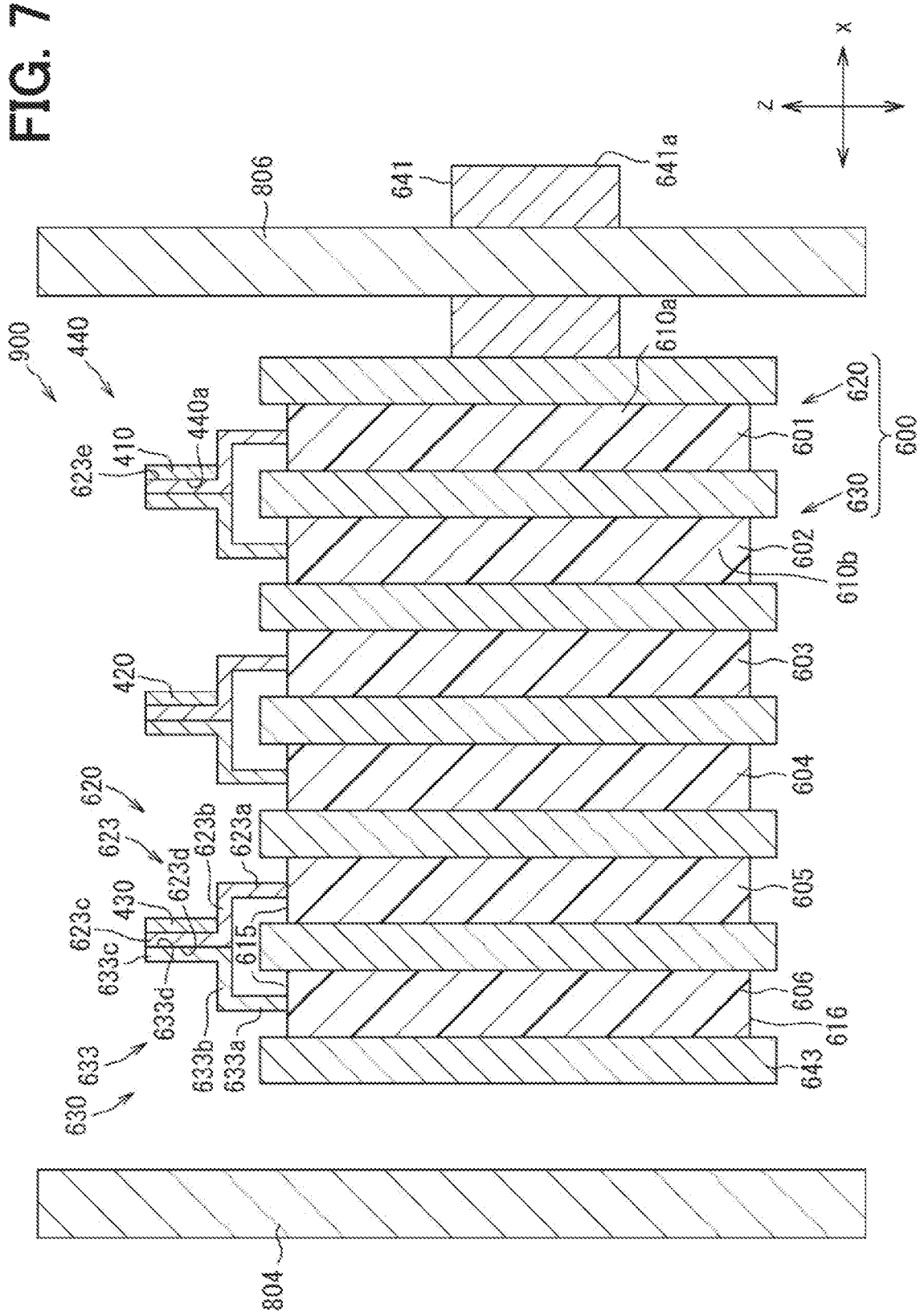
FIG. 7 is a sectional view of the power module taken along the line VII-VII of FIG. 2.

As illustrated in FIG. 7, the first output terminal 623 includes a first base portion 623a, a first relay portion 623b, and a first extension portion 623c. The first base portion 623a protrudes and extends from the first resin member 610a in the z-direction to separate from the top surface 615. The first relay portion 623b extends from the end of the first base portion 623a in the x-direction to separate from the supply port 641a and the discharge port 642a. The first extension portion 623c extends from the end of the first relay portion 623b in the z-direction to separate from the top surface 615.

The second output terminal 633 includes a second base portion 633a, a second relay portion 633b, and a second extension portion 633c. The second base portion 633a protrudes and extends from the second resin member 610b in the z-direction to separate from the top surface 615. The second relay portion 633b extends from the end of the second base portion 633a in the x-direction toward the supply port 641a and the discharge port 642a. The second extension portion 633c extends from the end of the second relay portion 633b in the z-direction to separate from the top surface 615.

The first base portion 623a separately faces the second base portion 633a in the x-direction. A first end face 623d separates from the supply port 641a and the discharge port 642a of the first extension portion 623c in the x-direction. The first end face 623d closely faces a second end face 633d toward the supply port 641a and the discharge port 642a of the second extension portion 633c in the x-direction. The first end face 623d and the second end face 633d are joined by laser welding, for example. Consequently, the first output terminal 623 and the second output terminal 633 are directly joined.

Figure 4:
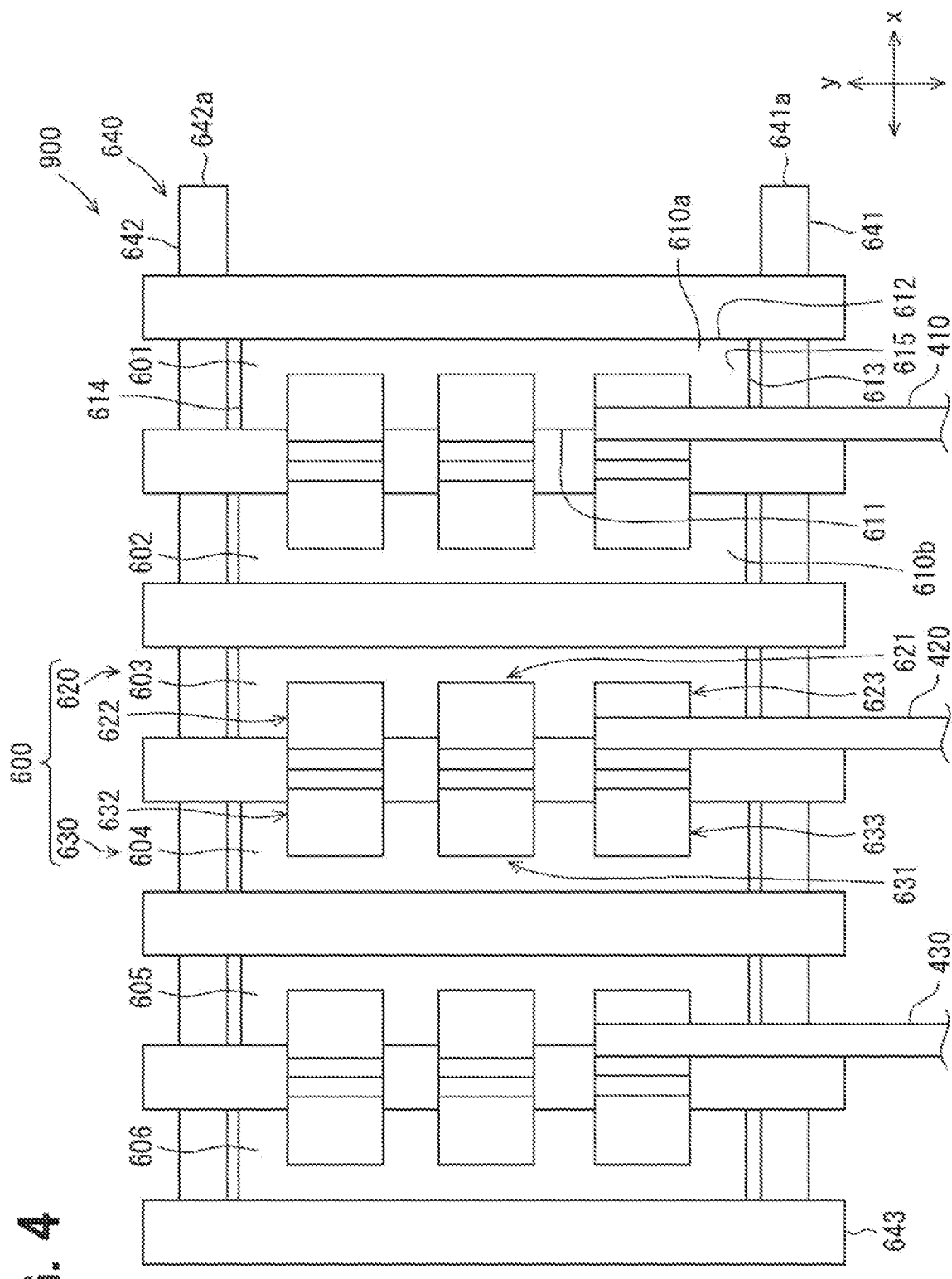
FIG. 4 is a plan view illustrating the power module connected to an output bus bar.

As illustrated in FIG. 4, the first output terminal 623 connects with the output bus bar 440 as well as the second output terminal 633. The output bus bar 440 is a flat, conductive metal plate that is thin in the x-direction. As illustrated in FIG. 7, a bus bar principal surface 440a of the output bus bar 440 faces an output surface 623e on the reverse side of a first end face 623d of the first output terminal 623 in the x-direction. The bus bar principal surface 440a and the output surface 623e are joined by laser welding, for example.

Consequently, the U-phase bus bar 410 is directly joined to the first output terminal 623 of the first U-phase module 601. The V-phase bus bar 420 is directly joined to the first output terminal 623 of the first V-phase module 603. The W-phase bus bar 430 is directly joined to the first output terminal 623 of the first W-phase module 605.

Positive Electrode Terminals

Figure 8:
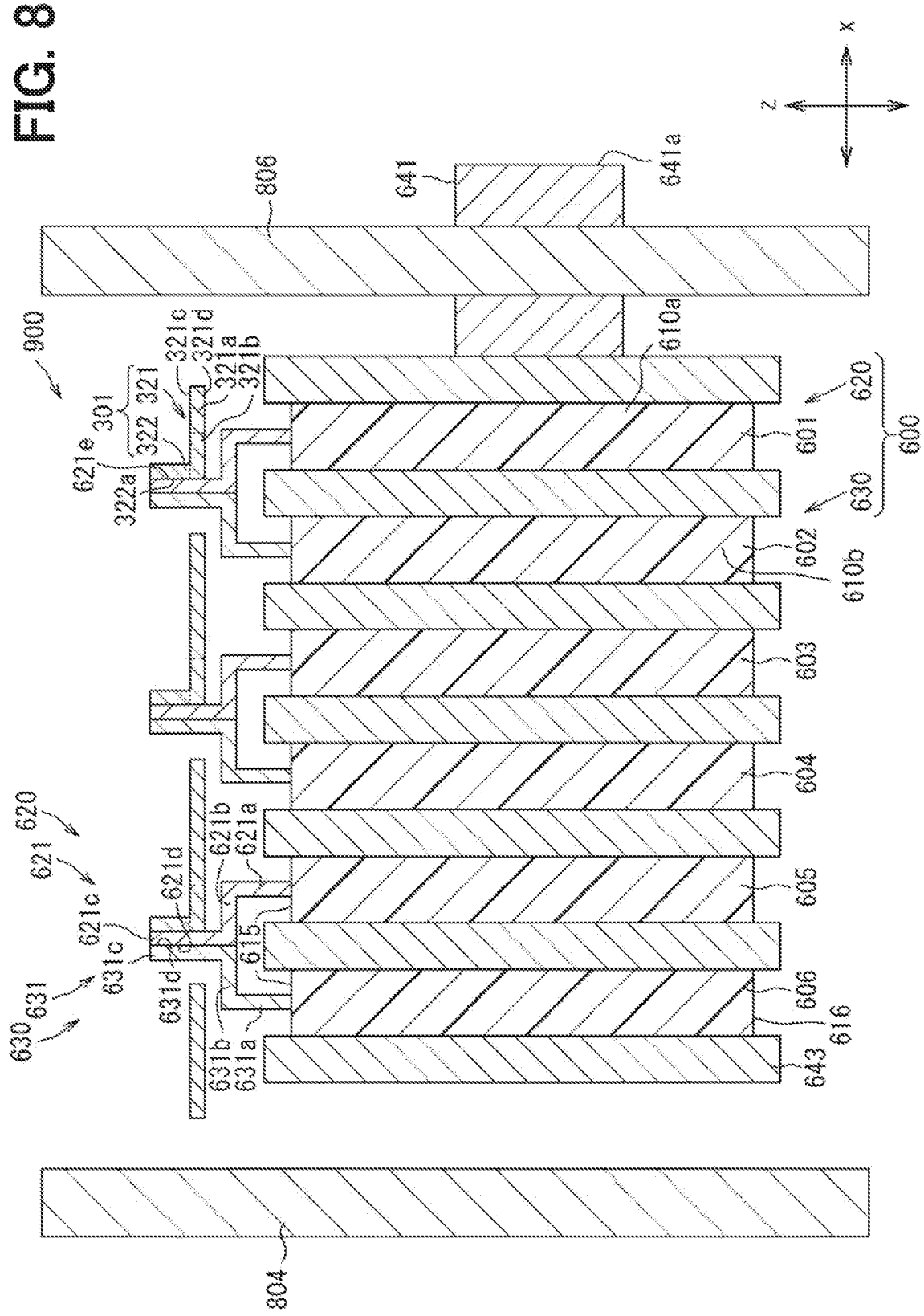
FIG. 8 is a sectional view of the power module taken along the line VIII-VIII of FIG. 2.

As illustrated in FIG. 8, the first positive electrode terminal 621 includes a third base portion 621a, a third relay portion 621b, and a third extension portion 621c. The third base portion 621a protrudes and extends from the first resin member 610a in the z-direction to separate from the top surface 615. The third relay portion 621b extends from the end of the third base portion 621a in the x-direction to separate from the supply port 641a and the discharge port 642a. The third extension portion 621c extends from the end of the third relay portion 621b in the z-direction to separate from the top surface 615.

The second positive electrode terminal 631 includes a fourth base portion 631a, a fourth relay portion 631b, and a fourth extension portion 631c. The fourth base portion 631a protrudes and extends from the second resin member 610b in the z-direction to separate from the top surface 615. The fourth relay portion 631b extends from the end of the fourth base portion 631a to the supply port 641a and the discharge port 642a in the x-direction. The fourth extension portion 631c extends from the end of the fourth relay portion 631b in the z-direction to separate from the top surface 615.

The third base portion 621a separately faces the fourth base portion 631a in the x-direction. The third end face 621d of the third extension portion 621c separates from the supply port 641a and the discharge port 642a in the x-direction. The fourth end face 631d of the fourth extension portion 631c is located toward the supply port 641a and the discharge port 642a. The third end face 621d closely faces the fourth end face 631d in the x-direction. The third end face 621d and the fourth end face 631d are joined by laser welding, for example. Consequently, the first positive electrode terminal 621 and the second positive electrode terminal 631 are directly joined.

Negative Electrode Terminals

Figure 9:
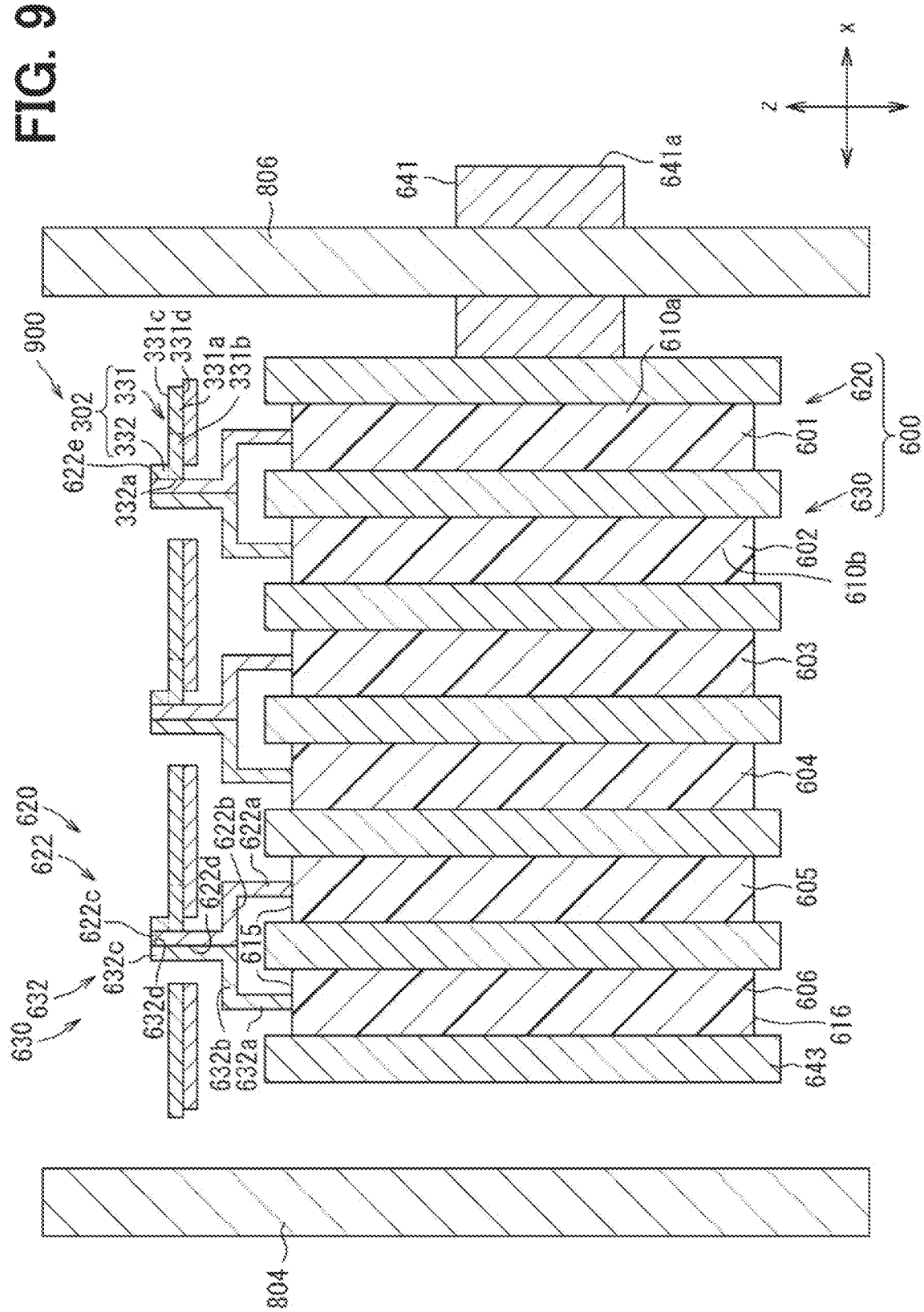
FIG. 9 is a sectional view of the power module taken along the line IX-IX of FIG. 2.

As illustrated in FIG. 9, the first negative electrode terminal 622 includes a fifth base portion 622a, a fifth relay portion 622b, and a fifth extension portion 622c. The fifth base portion 622a protrudes and extends from the first resin member 610a in the z-direction to separate from the top surface 615. The fifth relay portion 622b extends from the end of the fifth base portion 622a in the x-direction to separate from the supply port 641a and the discharge port 642a. The fifth extension portion 622c extends from the end of the fifth relay portion 622b in the z-direction to separate from the top surface 615.

The second negative electrode terminal 632 includes a sixth base portion 632a, a sixth relay portion 632b, and a sixth extension portion 632c. The sixth base portion 632a protrudes and extends from the second resin member 610b in the z-direction to separate from the top surface 615. The sixth relay portion 632b extends from the end of the sixth base portion 632a to the supply port 641a and the discharge port 642a in the x-direction. The sixth extension portion 632c extends from the end of the sixth relay portion 632b in the z-direction to separate from the top surface 615.

The fifth base portion 622a separately faces the sixth base portion 632a in the x-direction. The fifth end face 622d of the fifth extension portion 622c separates from the supply port 641a and the discharge port 642a in the x-direction. The sixth end face 632d of the sixth extension portion 632c is located toward the supply port 641a and the discharge port 642a. The fifth end face 622d closely faces the sixth end face 632d in the x-direction. The fifth end face 622d and the sixth end face 632d are joined by laser welding, for example. Consequently, the first negative electrode terminal 622 and the second negative electrode terminal 632 are directly joined.

Capacitor Case and Power Supply Bus Bars

The capacitor case 700 is made of an insulating resin material. As above, the capacitor case 700 stores the capacitor 310. As illustrated in FIG. 2, the first power supply bus bar 301 and the second power supply bus bar 302 are partially exposed from the capacitor case 700. The first power supply bus bar 301 is connected to one of two electrodes of the capacitor 310 and the second power supply bus bar 302 is connected to the other. The capacitors 310, the first power supply bus bar 301, and the second power supply bus bar 302 are resin-sealed on the capacitor case 700 with an encapsulating resin (unshown).

Storage in the Case

As above, the case 800 stores the capacitor case 700 and the power module 900. As shown in FIG. 2, the power module 900 and the capacitor case 700 are placed in the y-direction in the storage space of the case 800. The capacitor case 700 is located closer to the second sidewall 805 than the power module 900.

The first power supply bus bar 301 and the second power supply bus bar 302 are partially exposed from the capacitor case 700 toward the fourth sidewall 807 in the y-direction.

As above, the output bus bar 440 is directly joined to the first output terminal 623. The output bus bar 440 extends toward the fourth sidewall 807 and is exposed from the case 800 in the y-direction. The supply pipe 641 and the discharge pipe 642 are exposed from the third sidewall 806 in the x-direction.

First Power Supply Bus Bar

Figure 5:
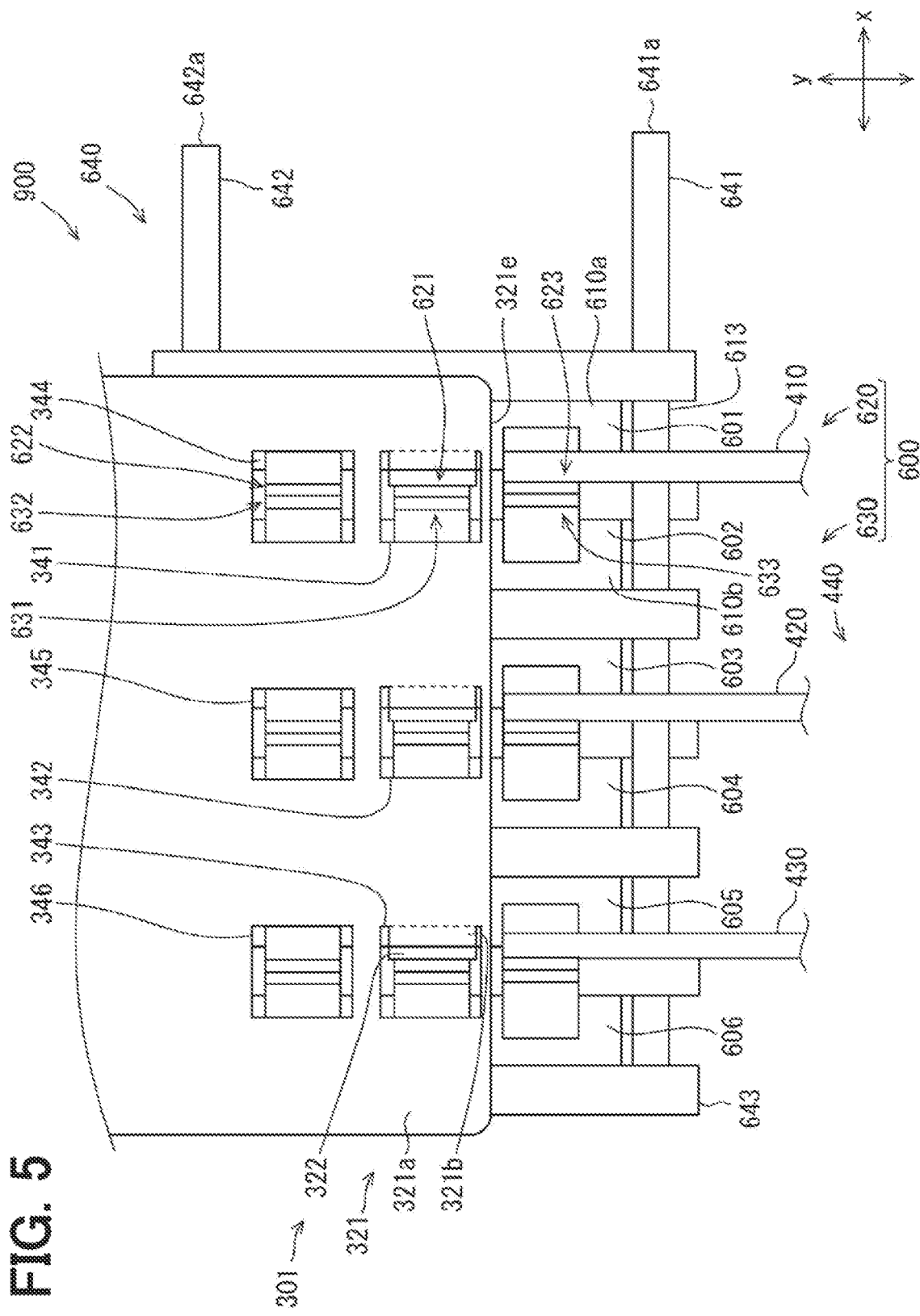
FIG. 5 is a plan view illustrating the power module connected to a first power supply bus bar.

The first power supply bus bar 301 is manufactured by pressing a conductive metal plate. As illustrated in FIGS. 5 and 8, the first power supply bus bar 301 includes a first main portion 321 and a first power supply portion 322. The first main portion 321 is thin in the z-direction. The first power supply portion 322 rises from the first main portion 321 in the z-direction and is thin in the x-direction. The description below explains the first main portion 321 in detail.

As illustrated in FIG. 8, the first main portion 321 is shaped to be flat and has a first outer surface 321c and a first inner surface 321d in the z-direction. The first main portion 321 is connected to one electrode of the capacitor 310. As illustrated in FIG. 2, the first main portion 321 extends from the capacitor case 700 to the fourth sidewall 807 in the y-direction. As illustrated in FIGS. 2 and 5, a first edge portion 321e of the first main portion 321 toward the fourth sidewall 807 is located between the first positive electrode terminal 621 or the second positive electrode terminal 631 and the first output terminal 623 or the second output terminal 633 in the y-direction.

As illustrated in FIGS. 5 and 8, the first main portion 321 includes a first conductive portion 321a and a second conductive portion 321b. The first conductive portion 321a includes six through-holes piercing through the first outer surface 321c and the first inner surface 321d. The second conductive portion 321b extends in the x-direction to separate from the edge of the through-hole and connects the first conductive portion 321a and the first power supply portion 322. The first conductive portion 321a has three through-holes placed in the x-direction toward the second sidewall 805 and three through-holes placed in the x-direction toward the fourth sidewall 807. The second conductive portion 321b is connected to the edges of three through-holes placed in the x-direction toward the fourth sidewall 807. The first conductive portion 321a is connected to one electrode of the capacitor 310. In FIG. 8, a broken line represents the boundary between the first conductive portion 321a and the second conductive portion 321b. A broken line represents the boundary between the second conductive portion 321b and the first power supply portion 322.

Of the six through-holes mentioned above, three through-holes placed in the x-direction toward the fourth sidewall 807 are denoted as a first through-hole 341, a second through-hole 342, and a third through-hole 343. Three through-holes placed in the x-direction toward the second sidewall 805 are denoted as a fourth through-hole 344, a fifth through-hole 345, and a sixth through-hole 346.

Toward the fourth sidewall 807, the three through-holes such as the first through-hole 341, the second through-hole 342, and the third through-hole 343 are placed in this order from the third sidewall 806 to the first sidewall 804 in the x-direction. Toward the second sidewall 805, the three through-holes such as the fourth through-hole 344, the fifth through-hole 345, and the sixth through-hole 346 are placed in this order from the third sidewall 806 to the first sidewall 804 in the x-direction.

The first through-hole 341 and the fourth through-hole 344 are separately placed in the y-direction. The second through-hole 342 and the fifth through-hole 345 are separately placed in the y-direction. The third through-hole 343 and the sixth through-hole 346 are separately placed in the y-direction.

The second conductive portion 321b is connected to the edges of the first through-hole 341 to the third through-hole 343 toward the third sidewall 806. As illustrated in FIG. 8, the first power supply portion 322 is connected to the end of the second conductive portion 321b toward the first sidewall 804. The first power supply portion 322 extends in the z-direction to separate from the second conductive portion 321b.

Second Power Supply Bus Bar

Figure 6:
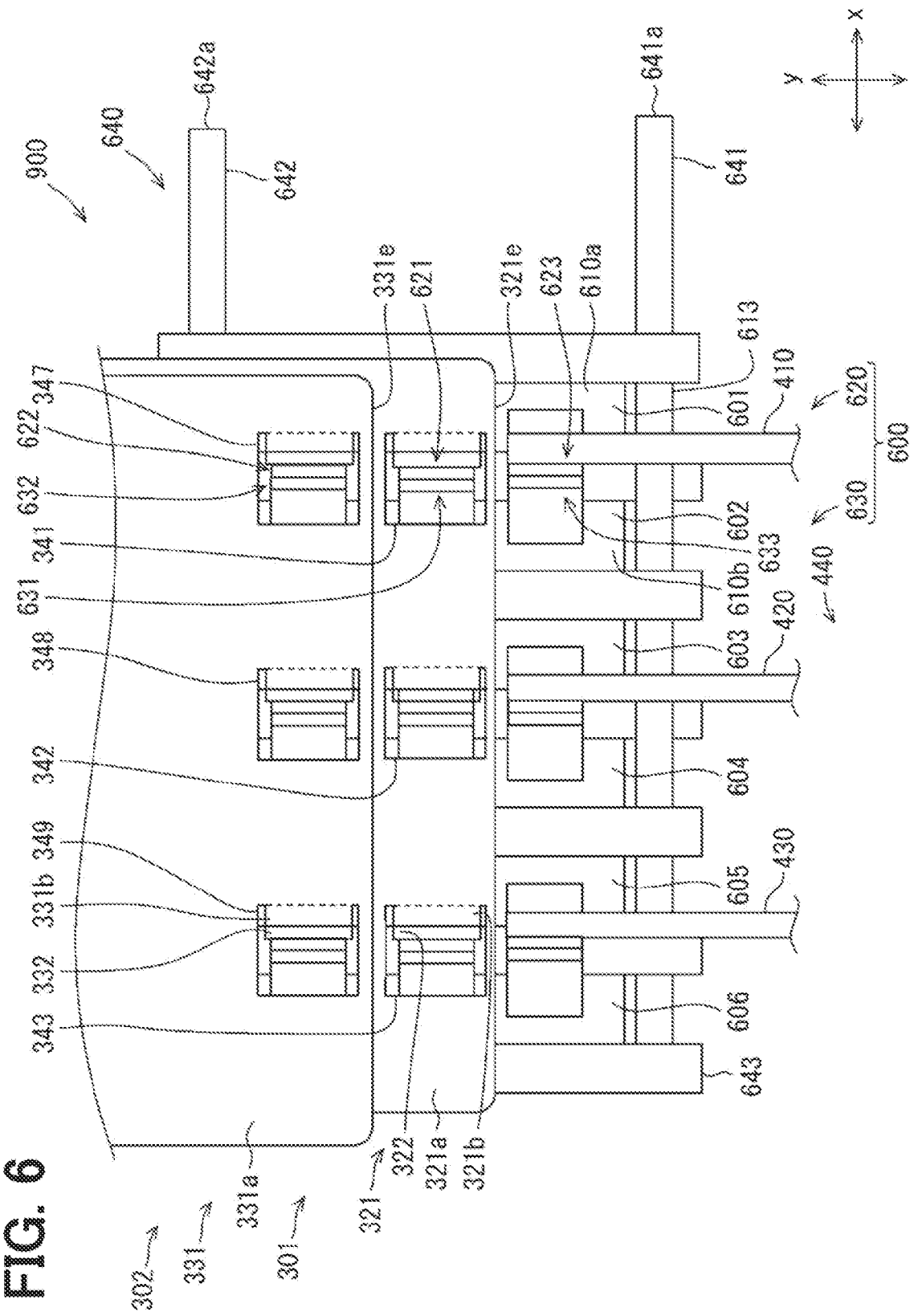
FIG. 6 is a plan view illustrating the power module connected to a second power supply bus bar.

The second power supply bus bar 302 is also manufactured by pressing a conductive metal plate. As illustrated in FIGS. 6 and 8, the second power supply bus bar 302 includes a second main portion 331 and a second power supply portion 332. The second main portion 331 is thin in the z-direction. The second power supply portion 332 rises from the second main portion 331 in the z-direction and is thin in the x-direction.

As illustrated in FIG. 9, the second main portion 331 is shaped to be thin and has a second outer surface 331c and a second inner surface 331c in the z-direction. The second main portion 331 is connected to the other electrode of the capacitor 310. As illustrated in FIG. 2, the second main portion 331 extends from the capacitor case 700 to the fourth sidewall 807 in the y-direction. As illustrated in FIGS. 2 and 6, the second edge portion 331e of the second main portion 331 toward the fourth sidewall 807 is located between the first negative electrode terminal 622 or second negative electrode terminal 632 and the first positive electrode terminal 621 or the second positive electrode terminal 631 in the y-direction. The description below explains the second main portion 331 in detail.

As illustrated in FIGS. 6 and 9, the second main portion 331 includes a third conductive portion 331a and a fourth conductive portion 331b. The third conductive portion 331a includes three through-holes piercing through the second outer surface 331c and the second inner surface 331d. The fourth conductive portion 331b extends to separate from the edge of the through-hole in the x-direction and connects the third conductive portion 331a and the second power supply portion 332. The third conductive portion 331a includes three through-holes placed in the x-direction. The fourth conductive portion 331b is connected to the edges of the three through-holes placed in the x-direction. The third conductive portion 331a is connected to the other electrode of the capacitor 310. In FIG. 9, a broken line represents the boundary between the third conductive portion 331a and the fourth conductive portion 331b. A broken line represents the boundary between the fourth conductive portion 331b and the second power supply portion 332.

Hereinafter, the above-described three through-holes are denoted as a seventh through-hole 347, an eighth through-hole 348, and a ninth through-hole 349. The three through-holes are placed from the third sidewall 806 to the first sidewall 804 in the order of the seventh through-hole 347, the eighth through-hole 348, and the ninth through-hole 349.

As above, the fourth conductive portion 331b is connected to the edges of the seventh through-hole 347 to the ninth through-hole 349. As illustrated in FIG. 9, the second power supply portion 332 is connected to the end of the fourth conductive portion 331b toward the first sidewall 804. The second power supply portion 332 extends in the z-direction to separate from the fourth conductive portion 331b. In FIG. 9, a broken line represents the boundary between the fourth conductive portion 331b and the second power supply portion 332.

Power Supply Bus Bar and Terminals

As illustrated in FIGS. 2 and 8, the first power supply bus bar 301 is provided toward the opening of the case 800 so that the first inner surface 321d faces the top surface 615 of the switch module 600 and the discharge pipe 642 in the z-direction.

As illustrated in FIGS. 5 through 9, the first positive electrode terminal 621 and the second positive electrode terminal 631 pass through each of the first through-hole 341 to the third through-hole 343 formed in the first conductive portion 321a toward the fourth sidewall 807. The first negative electrode terminal 622 and the second negative electrode terminal 632 pass through each of the fourth through-hole 344 to the sixth through-hole 346 toward the second sidewall 805.

Specifically, the first through-hole 341 exposes the third extension portion 621c of the first positive electrode terminal 621 of the first U-phase module 601 and the fourth extension portion 631c of the second positive electrode terminal 631 of the second U-phase module 602. The third extension portion 621c of the first U-phase module 601 is directly joined to the fourth extension portion 631c of the second U-phase module 602.

The second through-hole 342 exposes the third extension portion 621c of the first positive electrode terminal 621 of the first V-phase module 603 and the fourth extension portion 631c of the second positive electrode terminal 631 of the second V-phase module 604. The third extension portion 621c of the first V-phase module 603 is directly joined to the fourth extension portion 631c of the second V-phase module 604.

The third through-hole 343 exposes the third extension portion 621c of the first positive electrode terminal 621 of the first W-phase module 605 and the fourth extension portion 631c of the second positive electrode terminal 631 of the second W-phase module 606. The third extension portion 621c of the first W-phase module 605 is directly joined to the fourth extension portion 631c of the second W-phase module 606.

As illustrated in FIGS. 8 and 9, the second power supply bus bar 302 is provided toward the opening of the case 800 so that the second inner surface 331d faces the first outer surface 321c of the first power supply bus bar 301 in the z-direction. An insulating plate (unshown) is provided between the first outer surface 321c and the second inner surface 331d. The insulating plate ensures the insulation properties of the first power supply bus bar 301 and the second power supply bus bar 302. As illustrated in FIG. 2, the second edge portion 331e of the second power supply bus bar 302 is located closer to the second sidewall 805 than the first edge portion 321e of the first power supply bus bar 301.

As illustrated in FIGS. 5 and 6, the three through-holes formed in the third conductive portion 331a are communicated with some of the through-holes formed in the first conductive portion 321a in the z-direction. Specifically, the seventh through-hole 347 is communicated with the fourth through-hole 344 in the z-direction. The eighth through-hole 348 is communicated with the fifth through-hole 345 in the z-direction. The ninth through-hole 349 is communicated with the sixth through-hole 346 in the z-direction.

Connection Between the First Power Supply Bus Bar and the First Positive Electrode Terminal As above, the third extension portion 621c of the first positive electrode terminal 621 extends in the z-direction. The first power supply portion 322 also extends in the z-direction. As illustrated in FIG. 8, the third extension portion 621c faces the first power supply portion 322 in the x-direction. The seventh end face 621e of the third extension portion 621c toward the third sidewall 806 and the eighth end face 322a of the first power supply portion 322 toward the first sidewall 804 are joined by laser welding, for example. Consequently, the first positive electrode terminal 621 and the first power supply portion 322 are directly joined.

Connection Between the Second Power Supply Bus Bar and the First Negative Electrode Terminal As above, the fifth extension portion 622c of the first negative electrode terminal 622 extends in the z-direction. The second power supply portion 332 also extends in the z-direction. As illustrated in FIG. 9, the fifth extension portion 622c faces the second power supply portion 332 in the x-direction. The ninth end face 622e of the fifth extension portion 622c toward the third sidewall 806 and the tenth end face 332a of the second power supply portion 332 toward the first sidewall 804 are joined by laser welding, for example. Consequently, the first negative electrode terminal 622 and the second power supply portion 332 are directly joined.

Connection Between the Output Bus Bar and the Output Terminal

As above, the bus bar principal surface 440a of the output bus bar 440 faces the output surface 623e of the first output terminal 623 in the x-direction. The bus bar principal surface 440a and the output surface 623e are joined by laser welding, for example. Consequently, the output bus bar 440 is directly connected to the first output terminal 623.

Operation and Effect

As above, the first positive electrode terminal 621 and the second positive electrode terminal 631 are joined. The first negative electrode terminal 622 and the second negative electrode terminal 632 are joined. The first output terminal 623 and the second output terminal 633 are joined. A closed loop is formed on the positive electrode side via the first high-side switch 521 of the first module 620 and the second high-side switch 522 of the second module 630. A closed loop is formed on the negative electrode side via the first low-side switch 523 of the first module 620 and the second low-side switch 524 of the second module 630.

The closed loop may cause an LC resonance if the closed loop contains an inductance component or a capacitance component. However, according to the present embodiment, the first extension portion 623c of the first output terminal 623 and the second extension portion 633c of the second output terminal 633 are directly joined by laser welding, for example. It is possible to easily decrease inductance components between the first module 620 and the second module 630 compared to a configuration where the first output terminal 623 and the second output terminal 633 are indirectly joined via an inclusion such as a conductive member. This makes it easier to reduce an LC resonance occurring on each of the closed loops formed on the positive electrode side and the negative electrode side.

In addition to the first extension portion 623c of the first output terminal 623 and the second extension portion 633c of the second output terminal 633, the third extension portion 621c of the first positive electrode terminal 621 and the fourth extension portion 631c of the second positive electrode terminal 631 are directly joined by laser welding, for example. The fifth extension portion 622c of the first negative electrode terminal 622 and the sixth extension portion 632c of the second negative electrode terminal 632 are directly joined by laser welding, for example.

It is possible to easily decrease the sum of the inductance components contained in the closed loops formed on the positive electrode side and the negative electrode side compared to a configuration where only positive electrode terminals and negative electrode terminals are directly joined. This makes it easier to reduce an LC resonance occurring on each of the closed loops formed on the positive electrode side and the negative electrode side. It is possible to easily inhibit damage to the multiple switches provided for the first module 620 and the second module 630.

There has been described the preferred embodiment of the present disclosure. However, the disclosure is not limited to the above-mentioned embodiment but may be otherwise variously modified within the spirit and scope of the disclosure.

(First Modification)

According to the present embodiment, the first output terminal 623 includes a first base portion 623a, a first relay portion 623b, and a first extension portion 623c. The second output terminal 633 includes a second base portion 633a, a second relay portion 633b, and a second extension portion 633c. The first end face 623d of the first extension portion 623c and the second end face 633d of the second extension portion 633c are joined by laser welding, for example.

However, as illustrated in FIG. 10, the first output terminal 623 may include only the first base portion 623a extending in the z-direction. In this case, the second relay portion 633b of the second output terminal 633 extends from the second base portion 633a to the first base portion 623a in the x-direction. The second extension portion 633c extends from the end of the second relay portion 633b in the z-direction to separate from the top surface 615 and closely faces the first base portion 623a in the x-direction. The second extension portion 633c and the first base portion 623a are directly joined. Though unshown, the first output terminal 623 may include the first base portion 623a, the first relay portion 623b, and the first extension portion 623c. The second output terminal 633 may include only the second base portion 633a. The above-described configuration may be applied to not only the joint between output terminals but also the joint between the first positive electrode terminal 621 and the second positive electrode terminal 631 and the joint between the first negative electrode terminal 622 and the second negative electrode terminal 632.

(Other Modifications)

The present embodiment has provided the example in which the power conversion apparatus 300 includes the inverter 500. However, the power conversion apparatus 300 may include a converter in addition to the inverter 500.

The present embodiment has provided the example in which the power conversion apparatus 300 is included in the in-vehicle system 100 for electric vehicles. However, the power conversion apparatus 300 is not limited thereto. For example, the power conversion apparatus 300 may be included in a hybrid system equipped with a motor and an internal combustion engine.

The present embodiment has provided the example in which one motor 400 is connected to the power conversion apparatus 300. However, multiple motors 400 may be connected to the power conversion apparatus 300. In this case, the power conversion apparatus 300 includes multiple three-phase switch modules to configure an inverter.

While the present disclosure has been described with reference to preferred embodiments thereof, it is to be understood that the disclosure is not limited to the preferred embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. A power conversion device comprising:
   a first module including
      a first switch having a first electrode and a second electrode,
      a second switch having a third electrode and a fourth electrode,
      a first internal bus bar, which is connected to the first electrode,
      a second internal bus bar, which connects the second electrode with the third electrode,
      a third internal bus bar, which is connected to the fourth electrode, and
      a first resin member that encapsulates the first switch, the second switch, the first internal bus bar, the second internal bus bar, and the third internal bus bar, wherein a part of the first internal bus bar, a part of the second internal bus bar, and a part of the third internal bus bar are exposed from the first resin member;
   a second module including
      a third switch having a fifth electrode and a sixth electrode,
      a fourth switch having a seventh electrode and an eighth electrode,
      a fourth internal bus bar, which is connected to the fifth electrode and the first internal bus bar,
      a fifth internal bus bar, which connects the sixth electrode with the seventh electrode and is connected to the second internal bus bar,
      a sixth internal bus bar, which is connected to the eighth electrode and the third internal bus bar, and
      a second resin member that encapsulates the third switch, the fourth switch, the fourth internal bus bar, the fifth internal bus bar, and the sixth internal bus bar, wherein a part of the fourth internal bus bar, a part of the fifth internal bus bar, and a part of the sixth internal bus bar are exposed from the second resin member;
   a first power supply bus bar including
      a first power supply portion, which is electrically connected with the first internal bus bar and the fourth internal bus bar, and
      a through hole through which a fifth terminal of the third internal bus bar, which is exposed from the first resin member, and a sixth terminal of the sixth internal bus bar, which is exposed from the second resin member, extend; and
   a second power supply bus bar including
      a second power supply portion, which is electrically connected with the third internal bus bar and the sixth internal bus bar, and
      a through hole through which the fifth terminal and the sixth terminal extend, wherein
   at least one of a first terminal of the second internal bus bar, which is exposed from the first resin member, or a second terminal of the fifth internal bus bar, which is exposed from the second resin member, extends toward the other of the second internal bus bar and the fifth internal bus bar, such that the second internal bus bar and the fifth internal bus bar are directly joined with each other,
   at least one of a third terminal of the first internal bus bar, which is exposed from the first resin member, or a fourth terminal of the fourth internal bus bar, which is exposed from the second resin member, extends toward the other of the first internal bus bar and the fourth internal bus bar, such that the first internal bus bar and the fourth internal bus bar are directly joined with each other, and
   at least one of a fifth terminal of the third internal bus bar, which is exposed from the first resin member, or a sixth terminal of the sixth internal bus bar, which is exposed from the second resin member, extends toward the other of the third internal bus bar and the sixth internal bus bar, such that the third internal bus bar and the sixth internal bus bar are directly joined with each other.

2. The power conversion apparatus according to claim 1, wherein
   the through hole of the first power supply bus bar and the through hole of the second power supply bus bar overlap one another in a direction in which the fifth terminal and the sixth terminal extend, and the fifth terminal and the sixth terminal extend through the through hole of the first power supply bus bar and the through hole of the second power supply bus bar and are exposed through the through hole of the first power supply bus bar and the through hole of the second power supply bus bar.

3. The power conversion apparatus according to claim 2, wherein each of the fifth terminal and the sixth terminal is in a plate shape extending in the direction, and a plane surface of the fifth terminal is directly faced to a plane surface of the sixth terminal.

* * * * *